United States Patent [19]
Lepejian et al.

[11] Patent Number: 5,930,814
[45] Date of Patent: Jul. 27, 1999

[54] COMPUTER SYSTEM AND METHOD FOR SYNTHESIZING A FILTER CIRCUIT FOR FILTERING OUT ADDRESSES GREATER THAN A MAXIMUM ADDRESS

[75] Inventors: Yervant David Lepejian, Palo Alto, Calif.; Hrant Marandjian; Hovhannes Ghukasyan, both of Yerevan, Armenia; Lawrence Kraus, San Jose, Calif.

[73] Assignee: Credence Systems Corporation, Fremont, Calif.

[21] Appl. No.: 08/697,968

[22] Filed: Sep. 3, 1996

[51] Int. Cl.$^6$ .............................. G06F 12/00; G11C 29/00
[52] U.S. Cl. .............................. 711/1; 711/217; 371/21.1; 371/22.5
[58] Field of Search ..................................... 711/219, 220, 711/217, 1, 100; 371/21.1, 22.5, 22.3, 22.2, 22.1, 22.35; 365/201; 395/183.18, 183.06

[56] References Cited

U.S. PATENT DOCUMENTS

| | | |
|---|---|---|
| 5,138,619 | 8/1992 | Fasang et al. ........................... 371/22.5 |
| 5,258,986 | 11/1993 | Zerbe ....................................... 371/22.5 |
| 5,535,164 | 7/1996 | Adams et al. ............................ 365/201 |
| 5,617,531 | 4/1997 | Crouch et al. ....................... 371/183.06 |

*Primary Examiner*—Glenn Gossage
*Attorney, Agent, or Firm*—Smith-Hill and Bedell

[57] ABSTRACT

A method and circuit are provided for generating a minimum-sized address filter to detect when the address space of an embedded memory having a smaller address space than another larger embedded memory is being exceeded. The method includes decomposing a maximum address into alternating sequences of consecutive binary ones (1's) and zeros (0's), discarding a final sequence if it contains binary 1's, and generating a filter circuit from a filter function formed from the alternating sequences of consecutive binary 1's and 0's. A built-in self test (BIST) circuit incorporating the address filter provides the ability to test a plurality of embedded memories at full speed in parallel. A computer system including a computer program for generating the filter circuit may also be provided.

5 Claims, 4 Drawing Sheets

COMPUTER SYSTEM AND METHOD FOR SYNTHESIZING A FILTER CIRCUIT FOR FILTERING OUT ADDRESSES GREATER THAN A MAXIMUM ADDRESS

BACKGROUND OF THE INVENTION

The present invention relates to semiconductor integrated circuits and, more particularly, to test circuits built into the integrated circuits that enable efficient testing of embedded memory, especially read/write memory.

As integrated circuits (ICs) achieve higher and higher levels of integration it is common to find several memory blocks of differing sizes embedded within blocks of logic in the integrated circuit. A typical example of embedded memory is the data and instruction cache memories along with their associated tags and valid data cache memories that are embedded in most modern microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic.

Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs.

Testing of memories is generally accomplished by applying test vectors to the memory and reading back the results to ensure proper memory operation. However, testing an embedded memory through the surrounding logic may require a number of test vectors larger than the available memory available in the automatic test equipment used for testing the device and is, in any case, very time-consuming. It is additionally undesirable because the development of programs to execute such tests requires a large amount of skilled test engineering time, which adds to the overhead costs.

Another possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden.

To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used joint test action group (JTAG) standards. Special test modes which disable the normal operation of the circuit are invoked to enable BIST.

BIST attempts to provide complete fault coverage while minimizing test time and the area of the die that is occupied by the BIST circuitry. In some applications, it is also desirable that diagnostic information be available for faults that are detected. These requirements are in conflict, so various schemes have been developed which optimize one factor at the expense of the others.

One method for reducing the area on the chip devoted to data buses is to use a serial data-in line and a serial data-out line. Buffers are loaded serially and then used for parallel operation during writing, reading and comparison of the results read from the memory with the stored data. A disadvantage to this approach is that the maximum operational frequency is reduced by the width of the data word (e.g. 32 bits), so that the memory is tested at much less than operational frequency. Thus, faults that appear only at normal speed operation, such as capacitive coupling faults and transition faults, are not detected. Another consequence is that the time needed to test the memory is increased by the time necessary to load the buffers serially. This can increase the test time by a factor approximately equal to the width of the memory words.

Another approach is to add multiplexers to the memory input/output lines such that the data read from the memory can be loaded back into adjacent bits during the subsequent write while the memory is in the test mode. Thus, the data from bit 1 is available for writing into bit 2; the data from bit 2 is available for writing into bit 3; etc. The first bit receives new data and the data output from the last bit is routed back to the finite state machine BIST controller for comparison. In operational mode, the multiplexers connect the memory data lines to the chip data bus. Because data is always available for writing when a read operation is completed, the memory may be tested at operational speeds, which increases the quality and accuracy of the test procedure.

In one possible implementation of the above scheme, the output of the last bit of a word in the first memory is fed into the input of the first bit of a word in the second memory, etc. so as to make all of the memories into effectively one very wide memory for testing purposes. Another implementation involves adding a series of control lines so that each memory can be enabled separately. This allows each memory to be tested sequentially. In the case that the embedded memories are of differing depths, the second method must be used because the first method requires that the memory depths be the same.

There are certain drawbacks to these approaches. For example, although the above implementation offers the advantage of small area utilization, it is nonetheless relatively slow. Furthermore, in the case of a failure, all that is known is the word address of the failure. Information as to which bit failed is not available because the word is structured to operate as a serial shift register with no internal observability. Indeed, in the case that the first proposed method of chaining words in parallel is used, not even the memory that failed can be ascertained. For simple pass or fail testing, it is sufficient to identify that a failure has occurred. However, if redundancy is to be used to repair the failure or if the cause of the failure is to be analyzed, critical information is not available. In fact, if the word were to contain an even number of transition or capacitive coupling faults which cause the bit to read the opposite of the intended data, even the presence of the faults is masked.

An alternate approach is to generate data patterns and address sequences centrally and route them to the embedded memories. This approach is faster than the above serial test approach, especially if several embedded memories are tested in parallel. A drawback to this approach is that routing the extra data and address buses consumes significant amounts of area on the chip as the data path width increases from the historical size of 8 bits to 32 or 64 bits, which are increasingly common. It may not be possible to use the same buses for testing and normal operation because the testing signals should be routed in parallel to the embedded memories while the buses in operation are often separate, e.g. the case of data and instruction caches. This means that testing requires extra buses plus a multiplexer per data and address line.

While parallel testing of embedded memories is desirable from a speed standpoint, different embedded memories (e.g. data cache RAM and the associated tag cache RAM) in an integrated circuit are often not of the same size. If two memories of different sizes are tested by being written with the same data pattern, the data in the smaller memory will be overwritten starting with the lower order address space with the data intended to fill the remaining space in the larger memory if the process of writing to the smaller memory is not inhibited when its address space is exceeded. This situation could easily result in incorrect test results for the smaller memory.

Thus, it is seen from the above that an improved method and apparatus for BIST are needed to test integrated circuits with embedded memories of differing sizes.

SUMMARY OF THE INVENTION

The present invention minimizes the cost and maximizes the effectiveness of BIST by minimizing both the routing area devoted to the test signals and the area devoted to the circuits required to implement the BIST routines while providing the ability to test a plurality of embedded memories of differing size at full speed in parallel. Testing the memories at full speed reduces both test time and cost and improves the quality of the testing by providing the ability of detecting transitions and capacitively coupled faults.

In particular, a method and apparatus are provided for generating a minimum-sized address filter to detect when the address space of the smaller memories is being exceeded. By detecting when the address space of the smaller memories is being exceeded, the process of writing to the smaller memories can be controlled or inhibited while still writing to the larger memory, thereby allowing full speed testing of all embedded memories in the system in parallel. Furthermore, minimizing the address filter allows the area of the chip devoted to BIST to be minimized.

A further understanding of the nature and advantages of the inventions herein may be realized by reference to the remaining portions of the specification and the attached drawings.

DESCRIPTION OF THE PREFERRED EMBODIMENT

Figure 1:
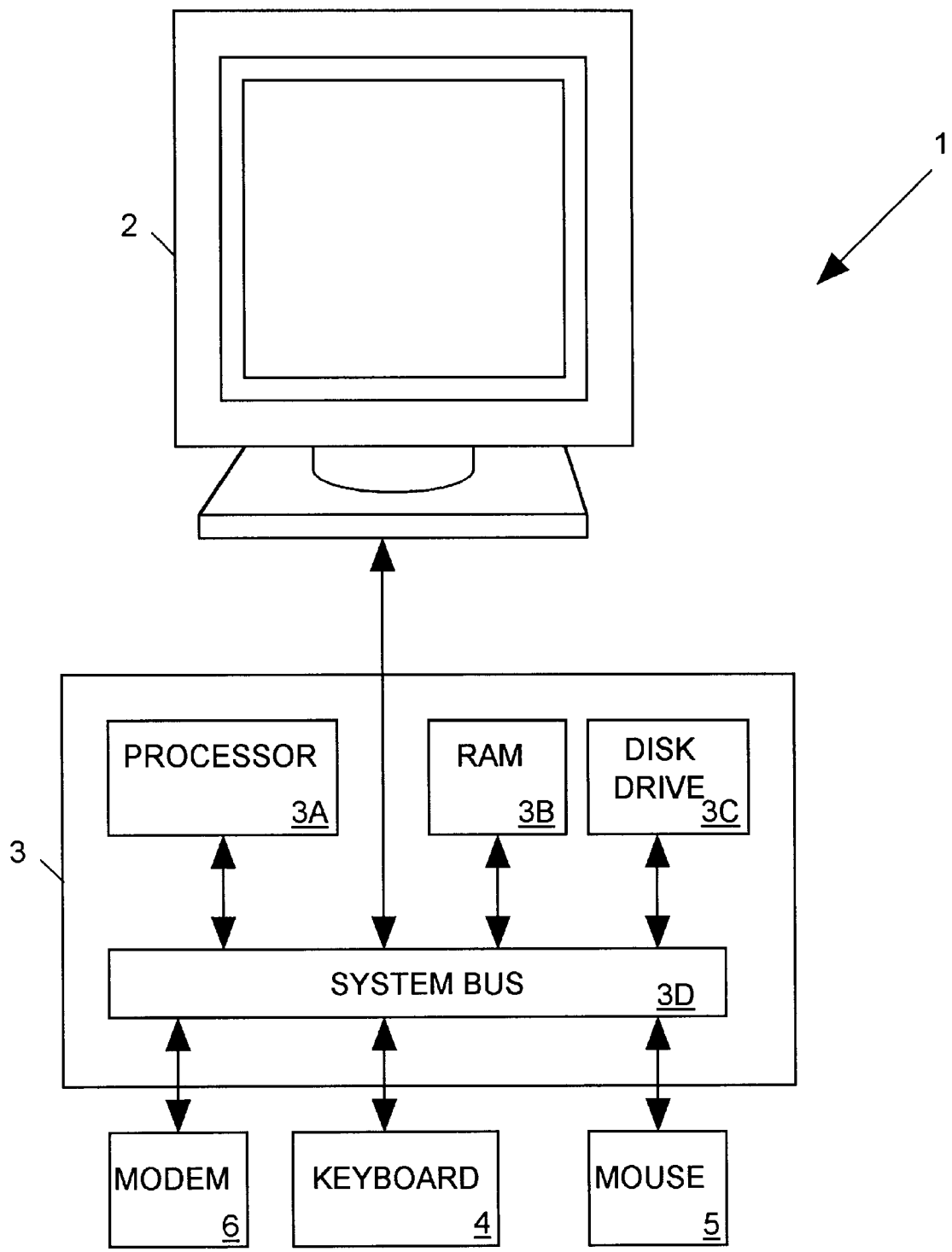
FIG. 1 is a simplified block diagram of a system according to a preferred embodiment of the present invention.

FIG. 1 shows a simplified block diagram of a system 1 according to a preferred embodiment of the present invention. System 1 includes, preferably, a display monitor 2, a computer 3, a keyboard 4, a mouse 5 and a modem 6. In alternate embodiments, the mouse 5 and/or modem 6 may be excluded from the system. Computer 3 includes familiar computer components such as processor 3a, memory storage devices such as a random access memory (RAM) 3b and a disk drive 3c, and a system bus 3d interconnecting the above components. Mouse 5 is only one example of a graphical input device; a trackball is another example. Modem 6 is but one example of a device that enables system 1 to be coupled to a network; a network interface card is another example. RAM 3b and disk drive 3c are examples of computer-readable memory (tangible media) for storage of the herein described computer code and computer programs. Other types of computer-readable media include floppy disks, removable hard disks, optical storage media such as compact disc read-only memories and bar codes, and semiconductor memories such as flash memory or read-only memory (ROM). It should be clear that FIG. 1 is representative of but one type of a system for embodying the present invention. It will be readily apparent to one of ordinary skill in the art that many system types and hardware and software configurations are suitable for use in conjunction with the present invention.

Figure 2:
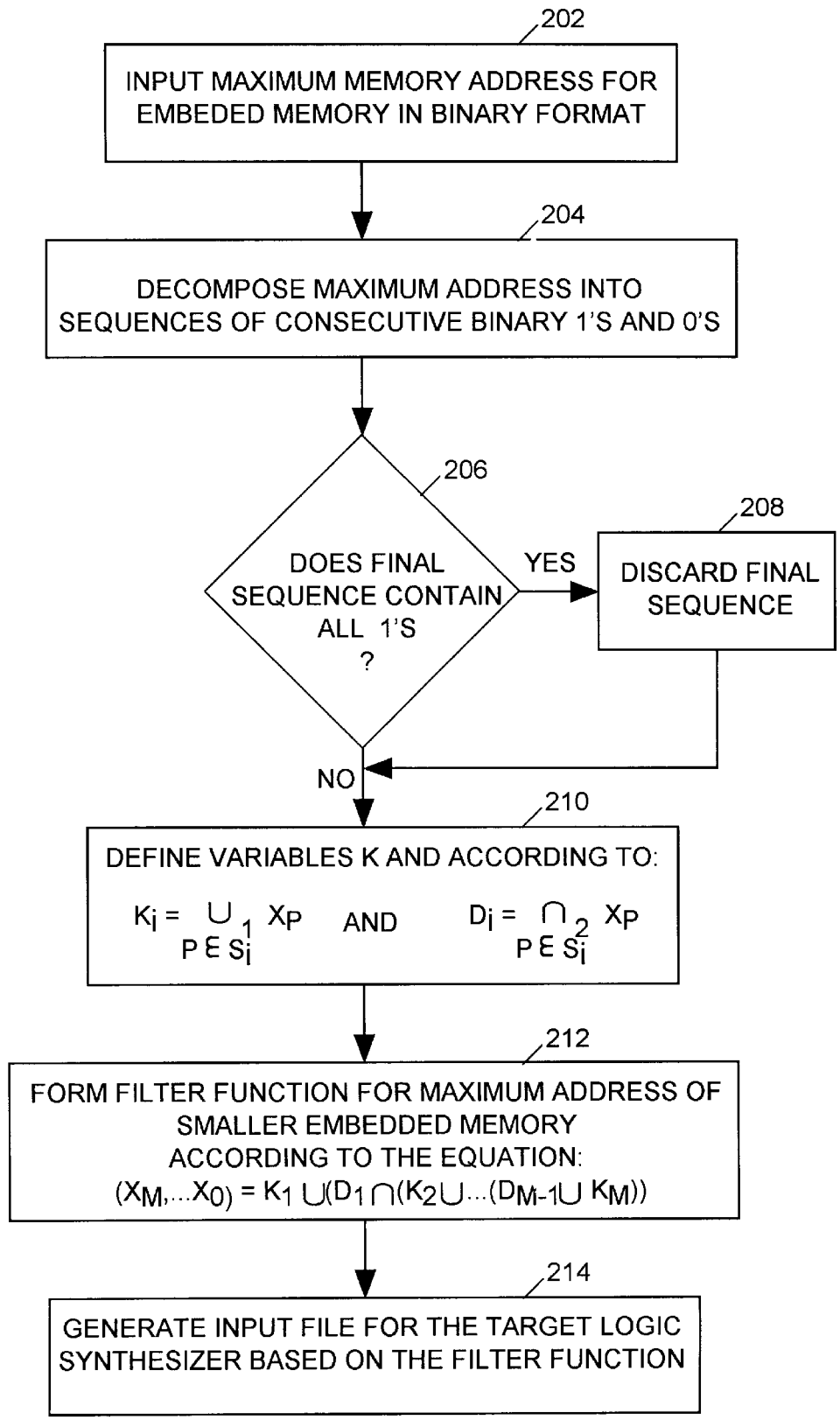
FIG. 2 is a flow diagram showing a preferred method according to the present invention for generating a minimum-sized address filter to detect when the address space of a smaller embedded memory is being exceeded.

FIG. 2 is a flow diagram 200 showing a method according to the present invention for generating a minimum-sized address filter to detect when the address space of a smaller embedded memory is being exceeded. Minimizing the address filter also allows the area of the chip devoted to BIST to be minimized. The method shown in FIG. 2 may be stored and implemented, for example, in the system of FIG. 1. In step 202, the maximum address for the smaller embedded memory is input in binary format. At step 204, this address is decomposed by separating it into sequences of consecutive binary 1's and 0's. For example, assume that a larger embedded memory in the integrated circuit has 64 address locations, while a smaller embedded memory in the same integrated circuit has 48 address locations. In that case, the maximum address input is 110000 (48 in binary notation for bits A5-A0). Thus, at step 204, sequence S1 would consist of bits A5 and A4 ("11"), while sequence S2 would consist of bits A3-A0 ("0000"). At step 206, the last sequence is checked to determine whether it is made up of all 1's. If so, at step 208, the last sequence can be discarded, since any address outside the allowed address space must change the entire series in addition to or besides the last series of 1's. If not, as in the present example where S2 is made up of 0's, the final sequence is kept for further processing.

At step 210, variables K and D are defined according to the following equations:

$$K_i = \bigcup_{\rho \in S_i^1} X_\rho \quad \text{and} \quad D_i = \bigcap_{\rho \in S_i^0} X_\rho$$

In the above equations, $S^1_i$ is the $i^{th}$ sequence of all 1's and $S^0_i$ is the ith sequence of all logical 0's of a binary number $(X_m \ldots, X_0)$ formed by discarding any sequence of logical 1's occurring at the end of the maximum address of the smaller memory. The variable $X_p$ is the $p^{th}$ element of the $S^1_i$ or $S^0_i$ sequence. Thus the above equations indicate that the variable $K_i$ is the logical AND of all elements of the $i^{th}$ sequence of all logical 1's of the number $(X_m \ldots, X_0)$ and $D_i$ is the logical OR of all elements of the $i^{th}$ sequence of all logical 0's of the number $(X_m \ldots, X_0)$. The filter function for the maximum address of a smaller embedded memory is then defined at step 212 by the following equation:

$$F(X_m, \ldots, X_0) = K_1 \bigcup (D_1 \bigcap (K_2 \bigcup \ldots (D_{m-1} \bigcup K_m)))$$

Therefore, for the present example, where the maximum address is 48, the filter function is defined by the equation:

$$F = (A_5 \bigcup A_4) \bigcup (A_3 \bigcap A_2 \bigcap A_1 \bigcap A_0)$$

At step 214, this filter function is created in the format of an input file for a target logic synthesizer. The logic synthesizer will use the input file to synthesize or create a circuit implementation for the address filter in a BIST function of an integrated circuit chip.

Figure 3:
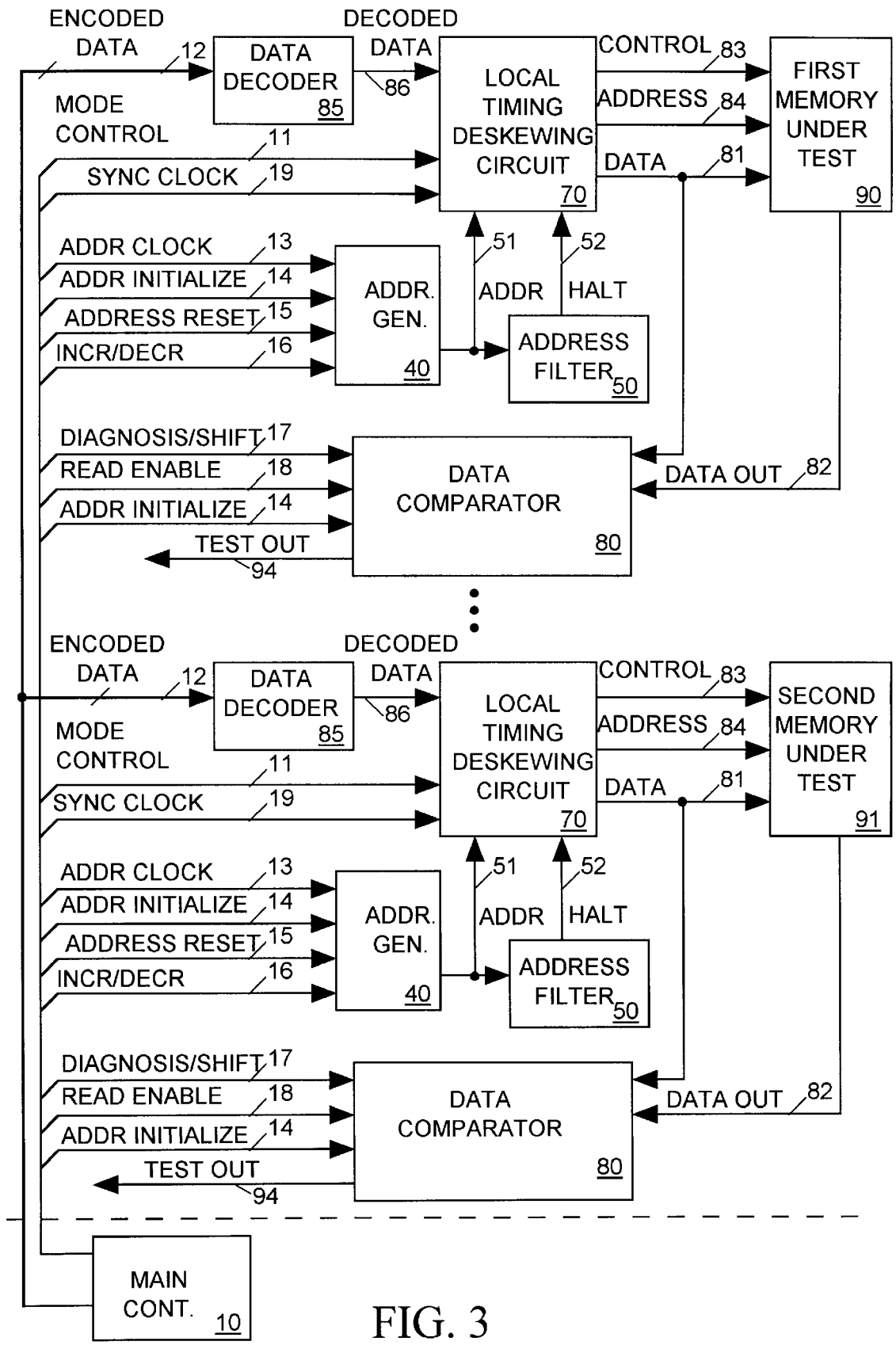
FIG. 3 is a block diagram of BIST circuiting and routing connections in accordance with the present invention.

FIG. 3 shows an overall block diagram of a preferred embodiment of a BIST function implementing an address filter generated by the method described above. The circuitry for a BIST function such as the one shown in FIG. 3 will typically be generated by a logic synthesizer that receives input files in a high-level design language describing the function to be performed, such as, merely by way of example, the input file created by the method described and shown in FIG. 2. In FIG. 3, those lines that are actually buses (multiple wires) are indicated by having a diagonal line across them. Main controller 10 controls the testing operation. In a preferred embodiment, there is one main controller 10 in each integrated circuit chip. The remaining set of blocks above the dashed line in FIG. 3 are distributed on the order of one full set of blocks per embedded memory array 90 or 91 in the chip that is to be tested. The blocks that are distributed for the BIST function are address generator 40, address filter 50, data decoder 85, data comparator 80 and local timing de-skewing circuit 70. Note that only one of various lines coupling main controller 10 to the distributed blocks is a bus, specifically encoded data bus 12. Even for this bus, the number of lines in the bus can be shown to be less than or equal to $\log_2$(number of patterns) for an encoding circuit that properly minimizes the width of the encoded data bus, as shown in related Application No. 08/697/969 for METHOD AND APPARATUS FOR BUILT-IN SELF TEST OF INTEGRATED CIRCUITS and incorporated by reference herein. The small number of lines required to be routed is an example of the improved efficiency of the present invention.

Main controller 10 is responsible for coordinating and synchronizing the tests that are conducted on each embedded memory array 90 or 91. Decoder 85 decodes the encoded data on bus 12 from main controller 10 and provides decoded data to local de-skewing circuit 70, which passes the data on decoded data bus 81 to the memory under test. Address generator 40 receives address clock 13, address initialize signal 14, address reset signal 15, and increment/decrement signal 16 from main controller 10 and supplies the addresses used in accessing memories 90 and 91 via de-skewing circuit 70. In one embodiment, address generator 40 is a pseudo-random address generator.

Address filter 50, generated by the method described in FIG. 2, produces a halt signal 52 indicating that the bounds of the address space of the smaller embedded memory have been exceeded. Assuming that first memory 90 is larger than second memory 91, address filter 50 generates the address halt signal 52 when the address space of the second (smaller) memory 91 has been exceeded. Halt signal 52 then freezes address signals 84 and data signals 81 to memory 91 at the last valid address used to access the memory. These signals remain frozen until another valid address (i.e. an address within the address space of the memory) is asserted. Thus, as long as address generator 40 provides addresses outside the address space of a smaller embedded memory, the last valid address location is repeatedly re-written and re-read with the old data appropriate for that location, even as other new data may be written to and read from other address locations in larger embedded memories in the integrated circuit chip. It should be noted that when a pseudo-random approach to address generation is employed, the addresses may be alternately in and out of the allowed address space for the smaller embedded memory 91. Thus, address filter 50 must respond intelligently to the pseudo-random sequence of addresses so as to lock out only those illegal addresses from the smaller address space.

Local timing de-skewing circuit 70 provides pulse shaping and edge placement for the input signals to each embedded memory array 90 and 91. The signals on address bus 84, control line 83 and decoded data bus 81 test embedded memories 90 and 91 by writing and reading 1's and 0's to and from all of the memory locations. De-skewing circuit 70 assures that there are no timing problems associated with accessing different embedded memory arrays 90 or 91 that may be separated by more than a centimeter on the integrated circuit chip.

Data comparator 80 compares the output data 82 from embedded memory 90 or 91 with the corresponding input data 81 and reports the results in a pass/fail format on test output line 94, under the control of diagnosis/shift signal 17 and read enable 18. Should the information be deemed valuable, in an alternate embodiment the addition of two lines would allow the data comparator to report the address location of any failing bits back to main controller 10. This information could then be combined with information regarding pattern and data state and be reported to an external tester for further analysis, redundancy repair or other similar actions.

Figure 4:
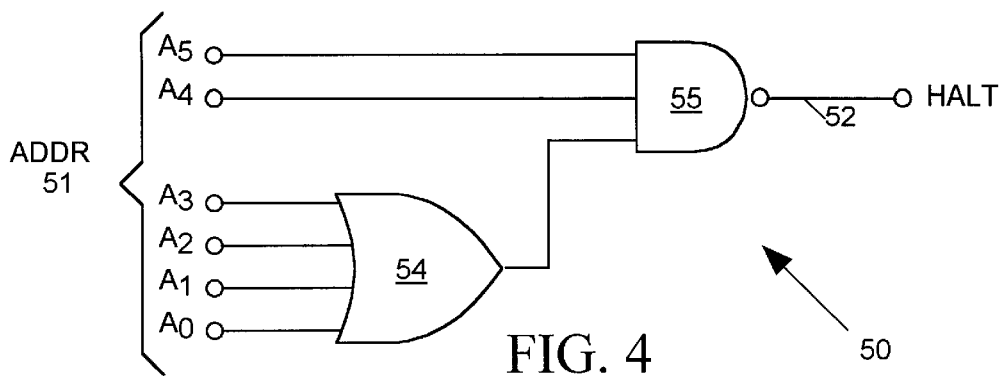
FIG. 4 is a logic diagram of an address filter generated by the method according to the present invention.
Figure 5:
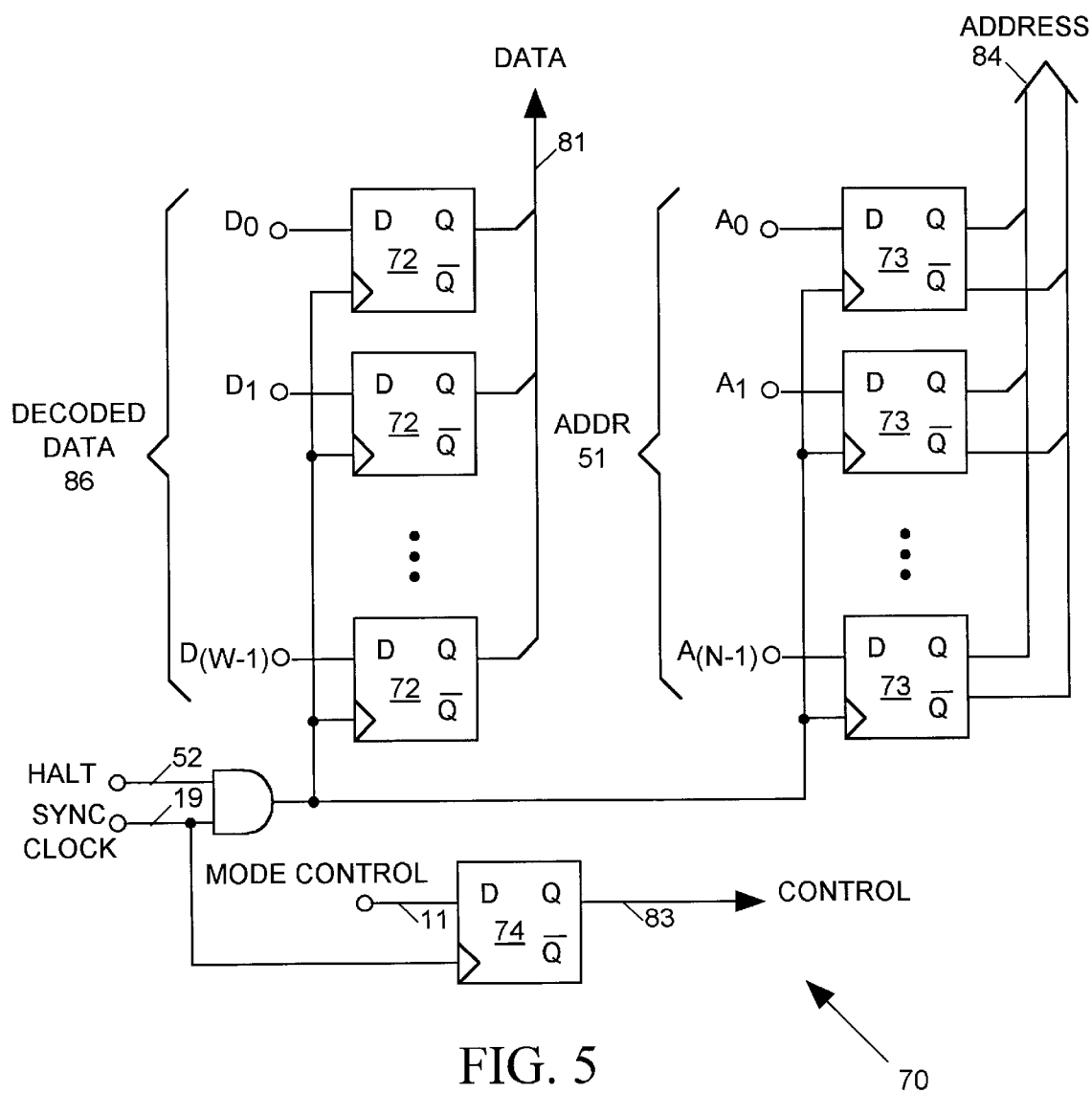
FIG. 5 is a logic diagram of an example of the local timing de-skewing logic according to the present invention.

FIG. 4 shows a logic diagram of a sample address filter 50 generated by the method described above. Again, address filter 50 is generated by a logic synthesizer after receiving an input file created by the method described above with respect to in FIG. 2. Returning to FIG. 3, assume again that the larger embedded memory 90 on the integrated circuit has an address space of 64 locations and that a smaller embedded memory 91 has an address space of 48 locations. Thus, in this case, halt signal 52 for the smaller memory must be generated whenever the address value on address bus 51 exceeds 47 (11000 in binary notation). Referring to FIG. 5, then, halt signal 52 will go low (logical "0") whenever the address on address bus 51 exceeds "1110000". This signal serves as an input to local timing de-skewing circuit 70.

FIG. 5 shows a simplified circuit diagram of local timing de-skewing circuit 70. De-skewing circuit 70 employs synchronously clocked D-type flip-flops 72 and 73 to provide the de-skewing function, as is common practice in very large scale integration (VLSI) design. An additional logic element, AND gate 71, inhibits the writing of test data to invalid address locations. As long as address halt signal 52 is high, the output of AND gate 71, which is essentially clock signal 19, continues to propagate control signal 83, address signals 84 and data signal 81 through to the embedded memory under test. However, when address halt signal 52 goes low, signifying an address out of bounds of the address space of a smaller embedded memory 91, the output of AND gate 71 is always low, freezing the outputs of latches 72 and 73 coupled to the data and address lines, respectively. Only control signal 83 is allowed to propagate through latch 74. Thus, reading and writing is restricted to the last valid address before the address space of the smaller memory was exceeded, and the data is therefore rewritten over and over again to the location of the last valid address.

The above description is illustrative and not restrictive. Many variations of the invention will become apparent to those of ordinary skill in the art upon review of this disclosure. The scope of the invention should, therefore, be determined not with reference to the above description, but instead should be determined with reference to the appended claims along with their full scope of equivalents.

What is claimed is:

1. A method of synthesizing a filter circuit implementation to filter out addresses greater than a maximum address in an address space of a memory block, the method comprising the steps of:

receiving the maximum address in a binary format;

decomposing the maximum address into alternating sequences of consecutive binary 1's and 0's;

discarding a final sequence of said alternating sequences if said final sequence contains binary 1's;

forming a filter function from said alternating sequences of consecutive binary 1's and 0's; and creating a filter circuit implementation in accordance with said filter function.

2. The method of claim 1 wherein said forming step further comprises the step of defining said filter function F by the equation $F(X_m, \ldots, X_0) = K_1 \cup (D_1 \cap (K_2 \cup \ldots (D_{m-1} \cup K_m)))$, where $$K_i = \bigcup_{p \in S_i^1} X_p \quad \text{and} \quad D_i = \bigcap_{p \in S_i^0} X_p$$

wherein $S^1_i$ is an $i^{th}$ sequence of all logical 1's and $S^0_i$ is the ith sequence of all logical 0's of a binary number $(X_m, \ldots, X_0)$ formed by discarding any sequence of 1's occurring at the end of a maximum address of the address range of the memory block.

3. The method of claim 1 wherein said synthesizing step comprises the step of generating an input file for a logic synthesizer, said logic synthesizer synthesizing the filter circuit using said input file.

4. A computer system for synthesizing a filter circuit implementation to filter out addresses greater than a maximum address in an address space of a memory block, the computer system comprising:

a computer-readable memory storing:

a first program for enabling said computer system to receive the maximum address in a binary format, to decompose the maximum address into alternating sequences of consecutive binary 1's and 0's, to discard a final sequence of said alternating sequences if said final sequence contains binary 1's; and to form a filter function from said alternating sequences of consecutive binary 1's and 0's; and a second program for creating a filter circuit implementation from said filter function.

5. The computer system of claim 4 wherein said filter function is defined by the equation $$F(X_m, \ldots, X_0) = K_1 \cup (D_1 \cap (K_2 \cup \ldots (D_{m-1} \cup K_m))),$$

where $$K_i = \bigcup_{p \in S_i^1} X_p \quad \text{and} \quad D_i = \bigcap_{p \in S_i^0} X_p$$

wherein $S^1_i$ is an $i^{th}$ sequence of all logical 1's and $S^0_1$ is the ith sequence of all logical 0's of a binary number $(X_m, \ldots, X_0)$ formed by discarding any sequence of 1's occurring at the end of a maximum address of the address range of the memory block.

* * * * *